(12) United States Patent
Gokmen et al.

(10) Patent No.: US 11,355,661 B2
(45) Date of Patent: Jun. 7, 2022

(54) HYBRID CZTSSE PHOTOVOLTAIC DEVICE

(71) Applicant: INTERNATIONAL BUSINESS MACHINES CORPORATION, Armonk, NY (US)

(72) Inventors: Tayfun Gokmen, Briarcliff Manor, NY (US); Oki Gunawan, Fair Lawn, NJ (US); Richard A. Haight, Mahopac, NY (US); Jeehwan Kim, Cambridge, MA (US); David B. Mitzi, Mohapac, NY (US); Mark T. Winkler, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/595,959

(22) Filed: Oct. 8, 2019

(65) Prior Publication Data

US 2020/0044107 A1 Feb. 6, 2020

Related U.S. Application Data

(63) Continuation of application No. 15/234,458, filed on Aug. 11, 2016, now Pat. No. 10,505,066, which is a
(Continued)

(51) Int. Cl.
*H01L 31/075* (2012.01)
*H01L 31/032* (2006.01)
(Continued)

(52) U.S. Cl.
CPC ........ *H01L 31/075* (2013.01); *H01L 31/0322* (2013.01); *H01L 31/0324* (2013.01);
(Continued)

(58) Field of Classification Search
CPC ..... Y02E 10/50; Y02E 10/541; Y02E 10/543; H01L 31/02167; H01L 31/022466;
(Continued)

(56) References Cited

U.S. PATENT DOCUMENTS

| 2011/0088765 A1 | 4/2011 | Lai et al. |
| 2011/0097496 A1 | 4/2011 | Mitzi et al. |

(Continued)

FOREIGN PATENT DOCUMENTS

| CN | 102097590 A | 6/2011 |
| CN | 102458832 A | 5/2012 |

(Continued)

OTHER PUBLICATIONS

List of IBM Patents or Patent Applications Treated as Related dated Oct. 8, 2019, 2 pages.
(Continued)

*Primary Examiner* — Mayla Gonzalez Ramos
(74) *Attorney, Agent, or Firm* — Tutunjian & Bitetto, P.C.; Samuel Walbaum

(57) ABSTRACT

A photovoltaic device includes a first contact and a hybrid absorber layer. The hybrid absorber layer includes a chalcogenide layer and a semiconductor layer in contact with the chalcogenide layer. A buffer layer is formed on the absorber layer, and a transparent conductive contact layer is formed on the buffer layer.

11 Claims, 4 Drawing Sheets

Related U.S. Application Data continuation of application No. 13/930,975, filed on Jun. 28, 2013, now Pat. No. 9,443,997.

(51) Int. Cl.
*H01L 31/0328* (2006.01)
*H01L 31/077* (2012.01)
*H01L 31/18* (2006.01)

(52) U.S. Cl.
CPC ...... *H01L 31/0326* (2013.01); *H01L 31/0328* (2013.01); *H01L 31/077* (2013.01); *H01L 31/18* (2013.01); *Y02E 10/541* (2013.01)

(58) Field of Classification Search
CPC ........... H01L 31/02568; H01L 31/0322; H01L 31/0324; H01L 31/0326; H01L 31/0328; H01L 31/03923; H01L 31/03925; H01L 31/0749; H01L 31/075; H01L 31/077; H01L 31/18
See application file for complete search history.

(56) References Cited

U.S. PATENT DOCUMENTS

| | | | |
|---|---|---|---|
| 2011/0226320 A1* | 9/2011 | Little | H01L 31/022466 136/256 |
| 2012/0097234 A1* | 4/2012 | Bojarczuk | H01L 31/0326 136/256 |
| 2012/0115312 A1 | 5/2012 | Agrawal et al. | |
| 2012/0138866 A1* | 6/2012 | Agrawal | H01L 21/02628 252/501.1 |
| 2012/0222730 A1 | 9/2012 | Gunawan et al. | |
| 2012/0266933 A1* | 10/2012 | Do | H01L 31/043 136/244 |
| 2012/0279565 A1 | 11/2012 | Mitzi et al. | |
| 2012/0318361 A1* | 12/2012 | Teeter | H01L 21/02557 136/264 |
| 2013/0025658 A1* | 1/2013 | Bedell | H01L 31/078 136/255 |
| 2013/0164886 A1* | 6/2013 | Liang | H01L 21/02491 438/95 |
| 2014/0179048 A1* | 6/2014 | Wu | H01L 31/1864 438/57 |

FOREIGN PATENT DOCUMENTS

| | | |
|---|---|---|
| JP | 2013004743 A | 1/2003 |
| JP | 2011515867 A | 5/2011 |
| JP | 2012253239 A | 12/2012 |
| JP | 2012253240 A | 12/2012 |

OTHER PUBLICATIONS

Gloeckler, M. "Device Physics of Cu(In,Ga)Se2 Thin-Film Solar Cells" Dissertation—Colorado State University. Jun. 2005. (158 Pages).

Gunawan, O., et al. "Loss Mechanisms in Hydrazine-Processed Cu2ZnSn(Se,S)4 Solar Cells" Applied Physics Letters, vol. 97, Issue 23. Dec. 2010. (3 pages).

Jackson, P., et al. "New World Record Efficiency for Cu(In,Ga)Se2 Thin-Film Solar Cells Beyond 20%" Progress in Photovoltaics: Research and Applications. Jan. 2011. (4 Pages).

Liu, Y., et al. "A New Simulation Software of Solar Cells—WXAMPS" Solar Energy Materials & Solar Cells, vol. 98. Mar. 2012. pp. 124-128.

Mitzi, D., et al. "The Path Towards a High-Performance Solution-Processed Kesterite Solar Cell" Solar Energy Materials & Solar Cells, vol. 95, Issue 6. Jun. 2011. (16 Pages).

Todorov, T., et al. "Beyond 11% Efficiency: Characteristics of State-Of-The-Art Cu2ZnSn(S,Se) 4 Solar Cells" Advanced Energy Materials. Aug. 2012. pp. 1-5.

Todorov, T., et al. "Solution-Processed Cu(In,Ga)(S,Se)2 Absorber Yielding a 15.2% Efficient Solar Cell" Progress in Photovoltaics: Research and Applications. Jan. 2012. (6 Pages).

* cited by examiner

HYBRID CZTSSE PHOTOVOLTAIC DEVICE

BACKGROUND

Technical Field

The present invention relates to photovoltaic devices, and more particularly to formation methods and devices using hybrid absorber layers comprised of a chalcogenide compound, such as, Cu—Zn—Sn—S/Se (CZTSSe) and another high quality solar semiconductor material.

Description of the Related Art

Cu—In—Ga—S/Se (CIGSSe) technology provides high performance solar cells with very high power conversion efficiency (PCE) of 20.3%. CIGSSe solar cells have a very large open circuit voltage (Voc) relative to bandgap with no known issues of interface recombination. Unfortunately the reliance on rare elements, such as indium, for example, limits very large scale deployment of this technology.

Cu—Zn—Sn—S/Se (CZTSSe) is an emerging thin film solar cell technology consisting of all earth abundant elements. While progress has been made in the development of CZTSSe solar cells particularly using hydrazine-based solution processing, a PCE of only 11.1% has been achieved.

Several major limitations in CZTSSe solar cells exist as well. For example, a low Voc may be experienced, which is suspected to be due to high buffer-absorber interface recombination, high bulk defect states, existence of tail states in the bulk and possible Fermi level pinning in the bulk or at an interface. Furthermore, CZTSSe also suffers from low fill factor (FF) which is mostly due to low Voc and higher series resistance from various layers or potential barrier formation across the device.

SUMMARY

A photovoltaic device includes a first contact and a hybrid absorber layer. The hybrid absorber layer includes a chalcogenide layer and a semiconductor layer in contact with the chalcogenide layer. A buffer layer is formed on the absorber layer, and a transparent conductive contact layer is formed on the buffer layer.

Another photovoltaic device includes a substrate, a first contact formed on the substrate, and a hybrid absorber layer. The hybrid absorber layer includes a Cu—Zn—Sn—S(Se) (CZTSSe) layer and at least one semiconductor layer in contact with the CZTSSe layer. A buffer layer is formed on the absorber layer, and a transparent conductive contact layer is formed on the buffer layer. Metal contacts are formed on the transparent conductive contact layer; the metal contacts and the transparent conductive contact layer form a front light-receiving surface.

A method for fabricating a photovoltaic device includes depositing a first contact on a substrate; forming a hybrid absorber layer on the first contact, the hybrid absorber layer including a Cu—Zn—Sn—S(Se) (CZTSSe) layer and another semiconductor layer in contact with the CZTSSe layer; forming a buffer layer on the absorber layer; depositing a transparent conductive contact layer on the buffer layer; and patterning metal contacts on the transparent conductive contact layer, the metal contacts and the transparent conductive contact layer forming a front light-receiving surface.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
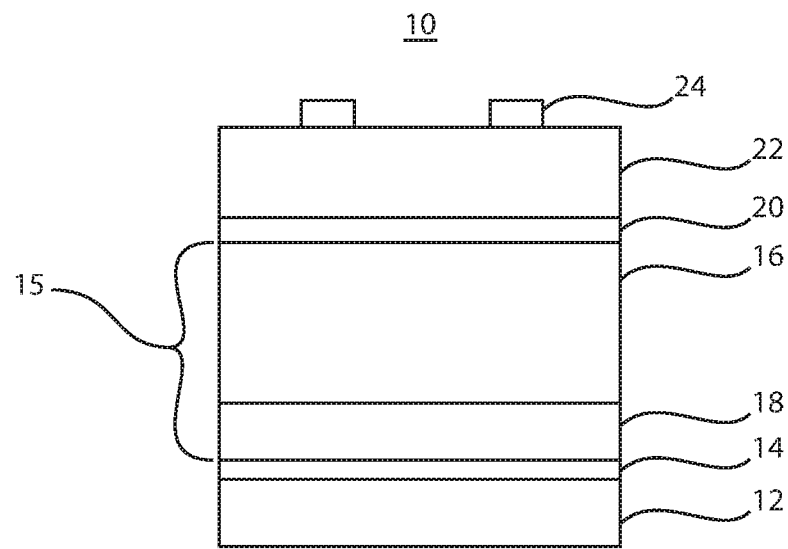
FIG. 1 is a cross-sectional view of a photovoltaic device designated as Type I in accordance with the present principles.

In accordance with the present principles, a hybrid $Cu_2(Zn,Sn)(S,Se)_4$ (CZTSSe) photovoltaic device is provided that combines the benefits of earth-abundant constituent elements of the CZTSSe and a high performance and high open circuit voltage of another high performance solar material (labeled "X" throughout for ease of reference). Semiconductor layer X may include, for example, CIGSSe or CdTe, although other semiconductor materials may be employed. Cu—In—Ga—S,Se (hereinafter CIGSSe) solar cells yield very high performance, with world record efficiency of 20.3%, although these materials are difficult to obtain and include expensive rare elements, such as Indium.

Hybrid CZTSSe devices may include a Type I device with a buffer/CZTSSe/X configuration, a Type II device with a buffer/X/CZTSSe configuration and a Type III device with a buffer/X/CZTSSe/X configuration. Compared to a baseline CZTSSe device with a same total absorber thickness, all types of hybrid devices provide higher power conversion efficiency. The hybrid CZTSSe device provides a new way for performance-material cost optimization for large scale deployment of thin film chalcogenide solar cells.

It is to be understood that the present invention will be described in terms of a given illustrative architecture having substrates and photovoltaic stacks; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for integrated circuit integration or may be combined with components on a printed circuit board. The circuit/board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or photovoltaic devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor. The photovoltaic devices described herein are particularly useful for solar cells or panels employed to provide power to electronic devices, homes, buildings, vehicles, etc.

It should also be understood that material compounds will be described in terms of listed elements, e.g., Cu—Zn—Sn—S(Se) (CZTSSe). The same applies for CIGSSe, CdS, etc. The compounds described herein may include different proportions of the elements within the compound, e.g., $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$, etc. In addition, other elements may be included in the compound, such as, e.g., dopants, and still function in accordance with the present principles. The compounds with additional elements will be referred to herein as alloys.

The present embodiments may be part of a photovoltaic device or circuit, and the circuits as described herein may be part of a design for an integrated circuit chip, a solar cell, a light sensitive device, etc. The photovoltaic device may be a large scale device on the order of feet or meters in length and/or width, or may be a small scale device for use in calculators, solar powered lights, etc.

It is also to be understood that the present invention may be employed in a tandem (multi-junction) structure. Other architectures, structures, substrate materials and process features and steps may be varied within the scope of the present invention. The tandem structure may include one or more stacked cells.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, an illustrative photovoltaic structure 10 is illustratively depicted in accordance with one embodiment. The photovoltaic structure 10 may be employed in solar cells, light sensors, photosensitive devices or other photovoltaic applications. The structure 10 will be referred to hereinafter as a Type I structure. The structure 10 includes a substrate 12. The substrate 12 may include glass or other inexpensive substrate, such as metal, plastic or other material suitable for photovoltaic devices (e.g., quartz, silicon, etc.). A conductive layer 14 is formed on the substrate 12. The conductive layer 14 may include molybdenum although other high work-function materials may be employed (e.g., Pt, Au, etc.). The layer 14 provides a metal contact.

A hybrid absorber layer 15 includes a layer 16 including a Cu—Zn—Sn containing chalcogenide compound with a kesterite structure of the formula: $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$ (hereinafter CZTSSe). In a particularly useful embodiment, the Cu—Zn—Sn-containing chalcogenide includes $Cu_2ZnSn(S,Se)_4$. In one embodiment, the CZTSSe film or layer 16 has a thickness of between about 0.2 to 4.0 microns and more preferably about 2 microns. Layer 16 may be formed by painting, sputtering, co-evaporation, electroplating, spin coating, slit casting, doctor blading, dip coating or other simple coating processes. In one illustrative embodiment, layer 16 includes CZTS (or CZTS with some Se substituted for S) which provides a band gap ($E_g$) from about 1 to 1.5 eV. Although the major elements in CZTS are Cu, Zn, Sn, S, Se, reference to CZTSSe or Cu—Zn—Sn containing chalcogenide material also includes compositions that optionally contain Ge replacing some or all of the Sn and that may also contain other dopants, including Sb, Bi, Na, K, Li, Ca, etc.

CZTSSe has many benefits. It is low cost and environmentally harmless, being fabricated using naturally abundant materials. CZTSSe provides good optical properties and has a band-gap energy from approximately 1 to 1.5 eV, depending on the degree of substitution of S with Se, and a large absorption coefficient in the order of $10^4$ cm$^{-1}$. Reducing the reliance on rare indium metal (also heavily consumed by one of the fastest growing industries—thin film displays) opens the possibility of almost limitless material supply.

A semiconductor layer 18 is formed on the conductive layer 14. Layer 16 is formed on the semiconductor layer 18. The semiconductor layer 18 will be referred to as material "X", which may include semiconductor material from groups IV, III-V, II-VI or I-III-VI$_2$. Semiconductor layer 18 may include, e.g., GaAs, Cu—In—Ga—S,Se (CIGSSe), CdTe Ge, etc. Semiconductor layer 18 and layer 16 complete the hybrid absorber layer 15. Semiconductor layer 18 may include monocrystalline, polycrystalline and even amorphous material.

In one embodiment, CIGSSe is employed for layer 18 and has a chemical formula of CuIn$_x$Ga$_{(1-x)}$Se$_2$ where the value of x can vary from 1 (pure copper indium selenide) to 0 (pure copper gallium selenide). CIGSSe is a tetrahedrally bonded semiconductor, with the chalcopyrite crystal structure, and a bandgap varying continuously with x from about 1.0 eV (for copper indium selenide) to about 1.7 eV (for copper gallium selenide). CIGSSe layer 18 provides high performance as open circuit voltage (Voc) provided using this material is very high relative to bandgap (Eg) (e.g., Eg/q—Voc~0.5 V) and no known issues of interface recombination. A buffer layer 20 is formed on the CIGSSe layer 18. The buffer layer 20 preferably includes CdS, which forms a high quality junction with layer 18, although other material may be employed.

The CIGSSe layer 18 may be manufactured by a vacuum-based co-evaporate or co-sputter processing of copper, gallium, and indium onto a substrate at room temperature, then annealing the resulting film with a selenide vapor to form the final CIGS structure. Other processes include electroplating. The Type I structure includes CZTSSe/X (CZTSSe on top of X, where light is coming through CZTSSe before X).

In some embodiments, the X layer 18 includes a thickness of between about 0.05 to about 2.0 microns and the CZTSSe layer 16 includes a thickness of between about 0.2 to about 2.0 microns. Although other thicknesses and combinations are contemplated.

A transparent conductive layer 22 is formed over the buffer layer 20. The transparent conductive layer 22 may include a transparent conductive oxide (TCO), such as, e.g., indium tin oxide (ITO), aluminum doped zinc oxide (AZO), boron doped zinc oxide (BZO) or other TCO materials. The transparent conductive layer 22 may include a thickness of between about 100 and 300 nm.

Metal contacts 24 may be formed on the transparent conductive layer 22 to further enhance the conductive properties of the transparent conductive layer 22. The metal contacts may include Ni, Al, Mo, Ag, Au, or any other suitable metal or alloy. Since the metal contacts 24 are on the front, light receiving side of the device 10, their size should be optimized to minimize shadowing loss and resistive loss.

Figure 2:
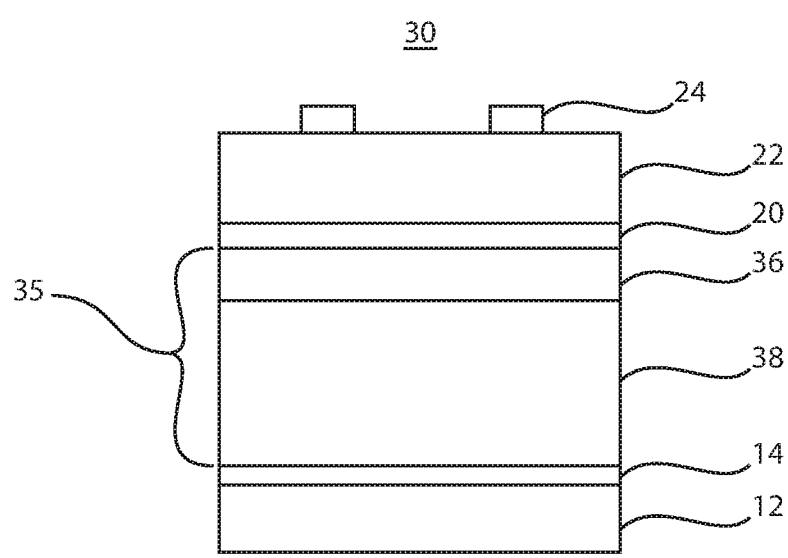
FIG. 2 is a cross-sectional view of a photovoltaic device designated as Type II in accordance with the present principles.

Referring to FIG. 2, an illustrative photovoltaic structure 30 is illustratively depicted in accordance with another embodiment. The photovoltaic structure 30 may be employed in solar cells, light sensors, photosensitive devices or other photovoltaic applications. The structure 30 will be referred to hereinafter as a Type II structure. The structure 30 includes the substrate 12. The substrate 12 may include glass or other inexpensive substrate, such as metal, plastic or other material suitable for photovoltaic devices (e.g., quartz, silicon, Mo, flexible substrate, etc.). The conductive layer 14 is formed on the substrate 12. The conductive layer 14 may include molybdenum although other high work-function materials may be employed (e.g., Pt, Au, etc.). The layer 14 provides a metal contact.

A hybrid absorber layer 35 includes a semiconductor layer 36 (X material) formed on a CZTSSe layer 38, which is formed of the conductive layer 14. The structure 30 is the same as that of structure 10 of FIG. 1 except that the materials of the hybrid layer 15 are switched for hybrid layer 35. The Type II structure includes X/CZTSSe (X layer is on top of CZTSSe). In some embodiments, the CZTSSe layer 38 includes a thickness of between about 0.1 to about 2 microns and the X layer 36 includes a thickness of between about 0.05 to about 2.0 microns. Although other thicknesses and combinations are contemplated.

Figure 3:
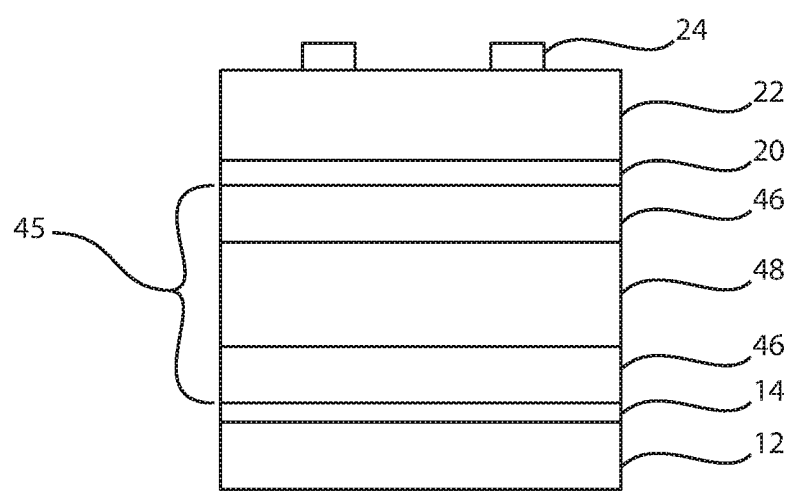
FIG. 3 is a cross-sectional view of a photovoltaic device designated as Type III in accordance with the present principles.

Referring to FIG. 3, an illustrative photovoltaic structure 50 is illustratively depicted in accordance with another embodiment. The photovoltaic structure 50 may be employed in solar cells, light sensors, photosensitive devices or other photovoltaic applications. The structure 50 will be referred to hereinafter as a Type III structure. The structure 50 includes the substrate 12. The substrate 12 may include glass or other inexpensive substrate, such as metal, plastic or other material suitable for photovoltaic devices (e.g., quartz, silicon, Mo, flexible substrate, etc.). The conductive layer 14 is formed on the substrate 12. The conductive layer 14 may include molybdenum although other high work-function materials may be employed (e.g., Pt, Au, etc.). The layer 14 provides a metal contact.

A hybrid absorber layer 45 includes a semiconductor layer 46 (X material) formed on the conductive layer 14. A CZTSSe layer 48 is formed on the semiconductor layer 46, and another semiconductor layer 46 is formed on the CZTSSe layer 48. The structure 50 sandwiches the CZTSSe layer 48 between two semiconductor layers 46. The Type III structure includes X/CZTSSe/X (X layer is on top and bottom of CZTSSe). In some embodiments, the CZTSSe layer 48 includes a thickness of between about 0.1 to about 2 microns and the X layers 46 include a thickness of between about 0.05 to about 2.0 microns. Although other thicknesses and combinations are contemplated.

Referring to FIGS. 4A-4E, simulation band diagrams are shown for different structures to demonstrate the present principles. Each diagram has axes that include energy (eV) versus position x (microns). Each diagram plots a conduction band (Ec), a valence band (Ev), a quasi Fermi level for electrons ($E_F$n) and a quasi Fermi level for holes ($E_{Fp}$).

Figure 4A:
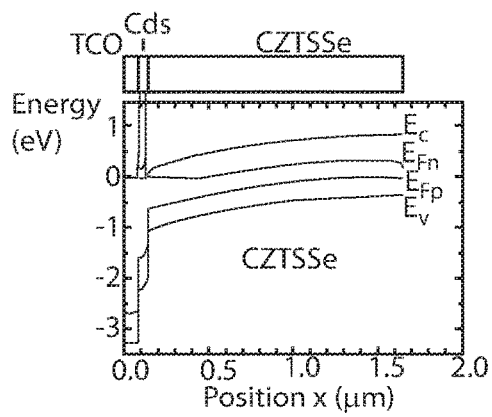
FIG. 4A is a band diagram and structure for a baseline CZTSSe device including a transparent conductive oxide (TCO), a CdS buffer layer and a CZTSSe absorber layer (with light coming from the TCO side)
Figure 4B:
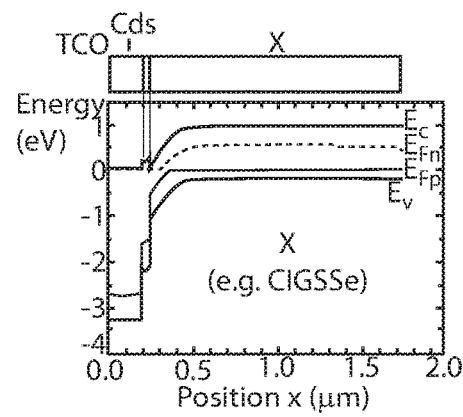
FIG. 4B is a band diagram and structure for a baseline material device including a transparent conductive oxide (TCO), a CdS buffer layer and a semiconductor absorber layer (X) (e.g., CIGSSe)
Figure 4C:
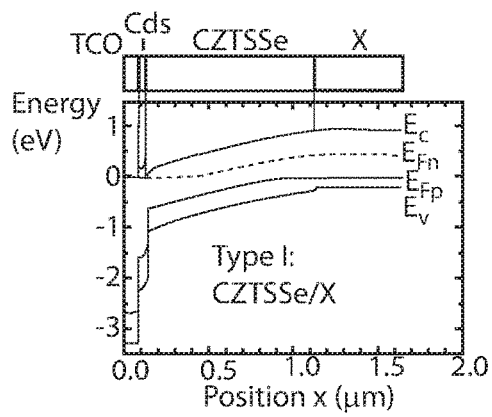
FIG. 4C is a band diagram and structure for a Type I device including a hybrid CZTSSe/semiconductor (X) absorber layer in accordance with one embodiment.
Figure 4D:
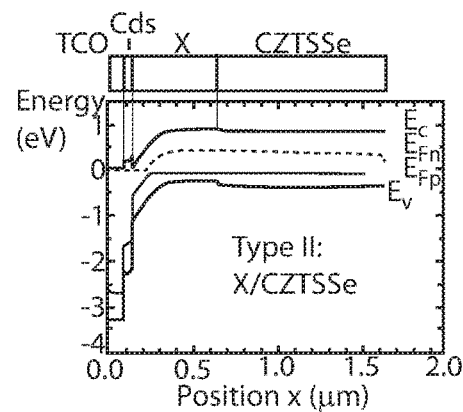
FIG. 4D is a band diagram and structure for a Type II device including a hybrid X/CZTSSe absorber layer in accordance with another embodiment.
Figure 4E:
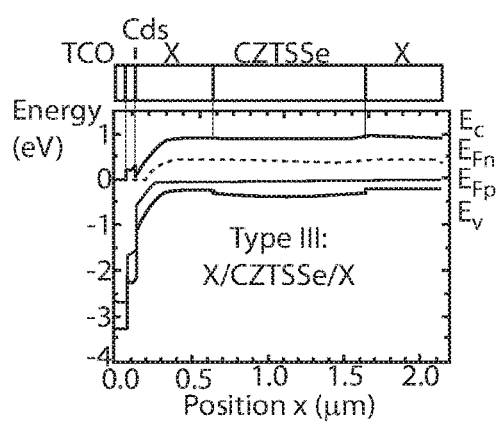
FIG. 4E is a band diagram and structure for a Type III device including a hybrid X/CZTSSe/X absorber layer in accordance with another embodiment.

FIG. 4A shows a band diagram and structure for a baseline CZTSSe device including a transparent conductive oxide (TCO), a CdS buffer layer and the CZTSSe absorber layer. FIG. 4B shows a band diagram and structure for a baseline X layer (in this example CIGSSe) device including a transparent conductive oxide (TCO), a CdS buffer layer and the X (CIGSSe) absorber layer. FIG. 4C shows a band diagram and structure for a Type I device including a hybrid CZTSSe/X absorber layer. FIG. 4D shows a band diagram and structure for a Type II device including a hybrid X/CZTSSe absorber layer. FIG. 4E shows a band diagram and structure for a Type III device including a hybrid X/CZTSSe/X absorber layer.

To illustrate the device physics of these hybrid solar cells device simulations were performed based on realistic device parameters for both CIGSSe (FIG. 4A) and CZTSSe (FIG. 4B) solar cells using the wxAMPS™ program. Also simulated were all three types of hybrid CZTSSe devices (FIGS. 4C, 4D and 4E). In this example, the baseline CZTSSe and X (CIGSSe) devices have efficiencies of 10.5% and 16.7% respectively, representing high performance devices that can be routinely produced from the respective technologies.

TABLE 1

Device performance comparison (Eff is efficiency) and $t_A$ is the absorber layer thickness.

| Device | $t_A$ (μm) | Eff % | FF % | Voc V | Jsc mA/cm² |
|---|---|---|---|---|---|
| Baseline CIGSSe (FIG. 4A) | 1.5 | 16.7 | 79.2 | 0.637 | 33.10 |
| Baseline CZTSSe (FIG. 4B) | 1.5 | 10.5 | 59.4 | 0.522 | 33.65 |
| Type I: CZTSSe/X (FIG. 4C) | 1/0.5 | 12.2 | 65.8 | 0.539 | 34.40 |
| Type II: X/CZTSSe (FIG. 4D) | 0.5/1 | 13.7 | 74.1 | 0.610 | 30.20 |
| Type III: X/CZTSSe/X (FIG. 4E) | 0.5/1/0.5 | 13.8 | 75.1 | 0.611 | 30.14 |

Table 1 shows that all hybrid devices (Type I, II and III) have higher efficiencies than the baseline CZTSSe device. However, the improvement mechanisms are notably different. To illustrate the benefits and working principle of these hybrid devices, a solar cell device simulation program was employed utilizing baseline CZTSSe and CIGSSe (as the "X" layer) absorber that yields a high performance CZTSSe and CIGSSe solar cell device that can be produced as shown in Table 1.

The Type I device yields higher Voc and higher Jsc. This Type I device effectively forms a p-i-n solar cell structure. The Type II device yields significantly higher open circuit voltage than the baseline CZTSSe device as the good quality X layer (in this case CIGSSe) directly forms the junction with the buffer layer. The Type III device is targeted to combine the beneficial characteristics of Type I and Type II devices and thus yield very high Voc, and the highest efficiency among all these three types of hybrid devices (slightly better than Type II).

The Type I hybrid cell yields the best Jsc that surpasses even the baseline devices. The device effectively works as a p-i-n device structure with the CZTSSe layer serving as the intrinsic layer and the X layer serving as the p-type layer. The buffer layer (CdS) serves as the n-type layer. The Jsc improvement stems from the near intrinsic character of the CZTSSe layer. A large potential difference between p and n introduces a wide region with large electric field that facilitates carrier drift and increases carrier collection and thus higher Jsc. Unfortunately, a thicker intrinsic-like CZTSSe layer increases the series resistance that degrades the FF. Thus, the thickness needs to be optimized.

In the Type II hybrid cell, the improvement is mainly in the Voc as the high quality X layer (e.g. CIGSSe) becomes the junction partner with the buffer (e.g., CdS). A high performance CIGSSe device has a very high Voc relative to bandgap (Eg/q—Voc~0.5 V) and no known issues of interface recombination with a CdS buffer.

In the Type III hybrid cell, the characteristics are almost identical to the Type II device with a slight improvement due to the addition of the X layer at the back contact (between the CZTSSe and back metal contact), which is targeted to improve the contact quality at the back and to create an electron mirror by having a higher conduction band near the back contact to reduce minority carrier recombination there.

There are several parameters that can be controlled to optimize the device performance while minimizing the material cost such as bandgap, thickness and the order of the CZTSSe and X layers. The device structures in accordance with the present principles offer high performance and cost effective thin film solar cells.

Figure 5:
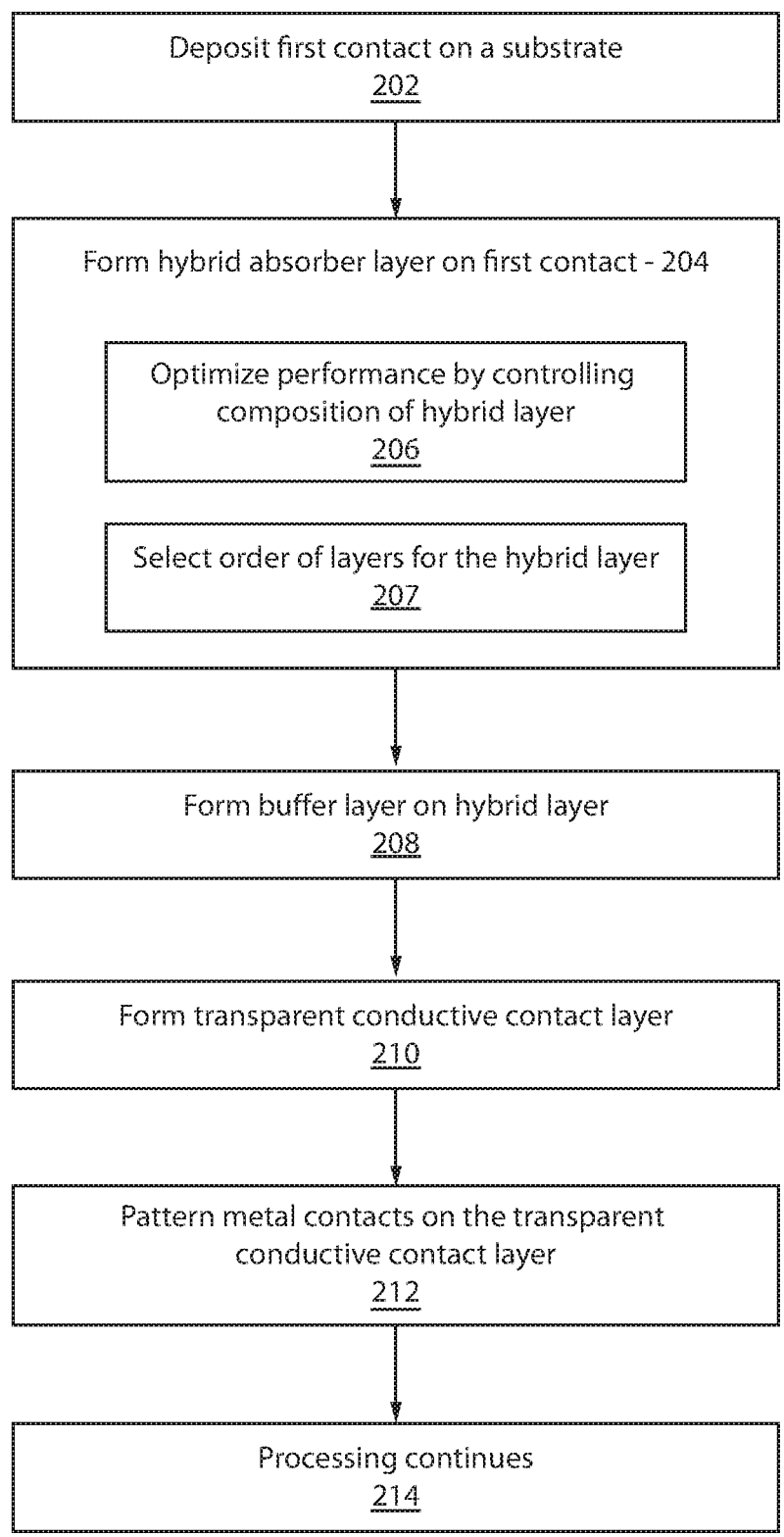
FIG. 5 is a block/flow diagram showing a method for forming a photovoltaic device with a hybrid absorber layer in accordance with illustrative embodiments.

Referring to FIG. 5, methods for fabricating a photovoltaic device is shown in accordance with illustrative embodiments. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 202, a first contact is deposited on a substrate. The first contact may include Mo or similar material, and the substrate may include glass or other substrate material including a flexible material (e.g., a polymer). In block 204, a hybrid absorber layer is formed on the first contact. The hybrid absorber layer includes a Cu—Zn—Sn—S(Se) (CZTSSe) layer and at least one X layer. The hybrid absorber layer may be formed in a single process chamber or may be processed in different processing chambers for each portion of the hybrid layer. The specific composition of each constituent layer of the hybrid layer may be determined to optimize the characteristics of the layer in accordance with the conditions and response needed in a given application.

The CZTSSe may include $Cu_{2-x}Zn_{1+y}Sn(S_{1-z}Se_z)_{4+q}$ wherein $0 \le x \le 1$; $0 \le y \le 1$; $0 \le z \le 1$; $-1 \le q \le 1$, and the X layer(s) may include CIGSSe (e.g., $CuIn_xGa_{(1-x)}Se_2$ where the value of x can vary from 1 to 0).

In block 206, performance is optimized by controlling the compositions of the hybrid absorber layer to control at least one of thickness and band gap during the formation of the hybrid absorber layer and its layers. In block 207, a placement order of the CZTSSe layer and the X layer is selected. In one embodiment, the CZTSSe layer is on top of the X layer. In another embodiment, the X layer is on top of the CZTSSe layer. The hybrid layer may also include X/CZTSSe/X. In the X/CZTSSe/X structure, the X layers may include the same or different semiconductor materials.

In block 208, a buffer layer is formed on the absorber layer. The buffer layer may include CdS although other materials may be employed, such as, e.g., CdTe, ZnS, Zn(O,S), $In_2S_3$, ZnO, etc. In block 210, a transparent conductive contact layer is deposited on the buffer layer. In block 212, metal contacts are patterned on the transparent conductive contact layer. The metal contacts and the transparent conductive contact layer preferably form a front light-receiving surface. The metal contacts are also preferably minimized to provide maximum light absorption. In block 214, processing may continue to complete the device.

Having described preferred embodiments for a hybrid CZTSSe photovoltaic device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A photovoltaic device, comprising:
   a hybrid absorber layer in electrical communication and in direct contact with a metal back contact, the hybrid absorber layer comprising:
      a Cu—Zn—Sn—S(Se) (CZTSSe) layer with kesterite crystal structure, wherein the Cu—Zn—Sn—S(Se) (CZTSSe) layer is intrinsic, wherein a degree of substitution of sulfur (S) with selenium (Se) provides for a band gap energy for the Cu—Zn—Sn—S(Se) (CZTSSe) layer ranging from 1 to 1.5 eV;
      a first semiconductor layer in contact with the CZTSSe layer, wherein the first semiconductor layer is a p-type semiconductor layer and comprises copper indium gallium sulfide (CIGs); and
      a second semiconductor layer of copper indium gallium sulfide (CIGs) that is in contact with a surface of the Cu—Zn—Sn—S(Se) (CZTSSe) layer that is opposite a surface of the Cu—Zn—Sn—S(Se) (CZTSSe) layer that the first semiconductor layer is present on, the first semiconductor layer and a cadmium sulfide layer that is n-type providing a p-i-n device having the hybrid absorber therebetween that is intrinsic, the second semiconductor layer providing a bandgap proximate to metal back contact that reduces minority recombination.

2. The photovoltaic device of claim 1, wherein the first semiconductor layer, the Cu—Zn—Sn—S(Se) (CZTSSe) layer, and the second semiconductor layer provide a p-i-n solar cell structure.

3. The photovoltaic device of claim 1, wherein the second semiconductor layer is a buffer layer.

4. The photovoltaic device of claim 3, further comprising a transparent conductive contact layer present on the buffer layer.

5. The photovoltaic device of claim 4, further comprising metal contacts formed on the transparent conductive contact layer.

6. The photovoltaic device of claim 5, wherein the metal contacts and the transparent conductive contact layer form a front light-receiving surface.

7. The photovoltaic device as recited in claim 1, wherein the first semiconductor layer includes $CuIn_xGa_{(1-x)}Se_2$ where a value of x can vary from 1 to 0.

8. A photovoltaic device, comprising:
   a hybrid absorber layer in electrical communication and in direct contact with a metal back contact, the hybrid absorber layer comprising:
      a Cu—Zn—Sn—S(Se) (CZTSSe) layer with kesterite crystal structure, wherein the Cu—Zn—Sn—S(Se) (CZTSSe) layer is intrinsic, wherein a degree of substitution of sulfur (S) with selenium (Se) provides for a band gap energy for the Cu—Zn—Sn—S(Se) (CZTSSe) layer ranging from 1 to 1.5 eV;
      a first semiconductor layer in contact with the CZTSSe layer, wherein the first semiconductor layer is a p-type semiconductor layer and comprises copper indium gallium sulfide (CIGs);
      a second semiconductor layer of copper indium gallium sulfide (CIGs) that is in contact with a surface of the Cu—Zn—Sn—S(Se) (CZTSSe) layer that is opposite a surface of the Cu—Zn—Sn—S(Se) (CZTSSe) layer that the first semiconductor layer is present on, wherein the second semiconductor layer; and
   a buffer layer of cadmium sulfide that is n-type present on the hybrid absorber layer, the first semiconductor layer, the hybrid absorber layer and the second semiconductor layer providing a p-i-n device, wherein the second semiconductor layer providing a bandgap proximate to the metal back contact that reduces minority recombination.

9. The photovoltaic device of claim 8, further comprising a transparent conductive contact layer present on the buffer layer.

10. The photovoltaic device of claim 8, further comprising metal contacts formed on the transparent conductive contact layer.

11. The photovoltaic device of claim 10, wherein the metal contacts and the transparent conductive contact layer form a front light-receiving surface.

* * * * *